(12) United States Patent
Best et al.

(10) Patent No.: US 12,035,509 B2
(45) Date of Patent: Jul. 9, 2024

(54) ASSEMBLY WITH A HEAT SINK CORE ELEMENT FORMING A SUPPORTING STRUCTURE

(71) Applicant: Phoenix Contact GmbH & Co. KG, Blomberg (DE)

(72) Inventors: Frank Best, Bueckeburg (DE); Fabio Welslau, Lemgo (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 366 days.

(21) Appl. No.: 17/352,386

(22) Filed: Jun. 21, 2021

(65) Prior Publication Data
US 2021/0410323 A1    Dec. 30, 2021

(30) Foreign Application Priority Data
Jun. 25, 2020 (BE) .................................. 2020/5466

(51) Int. Cl.
*H05K 7/20* (2006.01)

(52) U.S. Cl.
CPC ....... *H05K 7/2039* (2013.01); *H05K 7/20136* (2013.01)

(58) Field of Classification Search
CPC .............. H05K 1/0203; H05K 7/2039; H05K 7/20136; H05K 7/1474; H05K 7/20163; H05K 7/20509; H05K 7/20545; H05K 5/0204; H05K 5/0213
See application file for complete search history.

(56) References Cited

U.S. PATENT DOCUMENTS

| | | | | |
|---|---|---|---|---|
| 5,018,050 A | * | 5/1991 | Maenishi | H05K 7/209 361/717 |
| 5,218,516 A | | 6/1993 | Collins et al. | |
| 6,065,530 A | * | 5/2000 | Austin | H05K 9/0049 174/16.3 |
| 6,075,703 A | * | 6/2000 | Lee | H01L 23/4093 174/16.3 |
| 10,798,842 B1 | * | 10/2020 | Wen | H05K 7/1405 |
| 11,178,791 B2 | * | 11/2021 | Williams | H05K 7/1474 |

(Continued)

FOREIGN PATENT DOCUMENTS

| | | |
|---|---|---|
| CN | 201418225 Y | 3/2010 |
| CN | 202930319 U | 5/2013 |

(Continued)

*Primary Examiner* — Adam B Dravininkas
(74) *Attorney, Agent, or Firm* — LEYDIG, VOIT & MAYER, LTD.

(57) ABSTRACT

An assembly of an electrical device includes: at least one electrical functional assembly which has a supporting element and electrical or electronic functional components arranged on the supporting element; a fastening device for fastening the electrical device to a higher-level assembly; a heat sink core element having at least one face wall; and an external element connectable to the heat sink core element. The heat sink core element forms a supporting structure of the electrical device on which supporting structure the fastening device is arranged. The external element is connectable to the heat sink core element such that the at least one electrical functional assembly is accommodated between the at least one face wall of the heat sink core element and the external element.

27 Claims, 10 Drawing Sheets

(56) References Cited

U.S. PATENT DOCUMENTS

| | | | |
|---|---|---|---|
| 2004/0218367 A1 | 11/2004 | Lin et al. | |
| 2010/0290186 A1* | 11/2010 | Zeng | H05K 7/20545 |
| | | | 361/694 |
| 2013/0188320 A1* | 7/2013 | Moore | H05K 7/20509 |
| | | | 248/223.41 |
| 2016/0014927 A1 | 1/2016 | Chen et al. | |
| 2016/0330869 A1 | 11/2016 | Williams et al. | |
| 2017/0234494 A1* | 8/2017 | Yurich | F21V 7/04 |
| | | | 362/235 |
| 2018/0132380 A1* | 5/2018 | Baran | H05K 7/1465 |
| 2020/0214153 A1* | 7/2020 | Holahan | H05K 5/0213 |
| 2020/0413564 A1* | 12/2020 | Schörner | H05K 7/2039 |

FOREIGN PATENT DOCUMENTS

| | | |
|---|---|---|
| CN | 209842460 U | 12/2019 |
| DE | 102014109984 A1 | 1/2016 |
| DE | 102015111277 A1 | 1/2017 |
| EP | 0740499 A1 | 10/1996 |
| EP | 3090611 A1 | 11/2016 |
| JP | 2006261215 A | 9/2006 |
| WO | WO 2004105261 A1 | 12/2004 |
| WO | WO 2019219695 A1 | 11/2019 |

\* cited by examiner

ASSEMBLY WITH A HEAT SINK CORE ELEMENT FORMING A SUPPORTING STRUCTURE

CROSS-REFERENCE TO PRIOR APPLICATION

Priority is claimed to Belgian Patent Application No. BE 2020/5466, filed on Jun. 25, 2020, the entire disclosure of which is hereby incorporated by reference herein.

FIELD

The invention relates to an assembly of an electrical device, a modular system and an electrical device.

BACKGROUND

Such an assembly comprises at least one electrical functional assembly, which has a supporting element and electrical or electronic functional components arranged on the supporting element, and a fastening device for fastening the electrical device to a higher-level assembly, for example a mounting rail.

Such electrical devices serve, for example, to provide on a mounting rail an electrical functional arrangement, within whose framework different electrical devices can be combined with one another in order to provide different functions, for example automation functions, in an industrial installation, in building technology or in other environments. By being arranged on a mounting rail or on other fastening devices, electrical devices can be combined with one another, for example, in a switchgear cabinet, wherein for this purpose, electrical devices are usually lined up next to one another in a lining-up direction and connected to a mounting rail or another supporting base by latching, for example.

During operation, heat can be generated at such electrical devices due to an electrical power dissipation. It is therefore desirable to provide, on such electrical devices, cooling by means of which electrical and/or electronic components of electrical functional assemblies, for example on one or more printed circuit boards, can be cooled. Normally used for this purpose are heat sinks which are connected to the electrical functional assemblies so that via such heat sinks, heat can be absorbed, distributed and optionally dissipated, for example via a convection flow.

In particular, electrical devices for use in the field of communication technology, in particular 5G, in the field of edge computing or in the field of the so-called Industry 4.0 can generate considerable heat during operation, which heat must be dissipated in order to prevent such devices from overheating.

There is a need in this case for a flexibly configurable electrical device which can be compact but which can nevertheless provide efficient cooling for electrical or electronic components arranged on a printed circuit board.

DE 10 2014 109 984 A1 discloses an electronic device arrangement having a plurality of base modules. Each base module has an insulating material housing, a latching foot for latching onto a mounting rail, and plug contacts for the electrically conductive connection of associated plug contacts of an adjacent base module. An electronics module can be attached to a base module, wherein the electronics module has an intermediate element which can be arranged between side walls of the electronics module. Heat sinks can be accommodated in the electronics module.

DE 10 2015 111 277 A1 discloses a heat sink for a device that is to be attached to a mounting rail and that produces heat losses.

SUMMARY

In an embodiment, the present invention provides an assembly of an electrical device, comprising: at least one electrical functional assembly which has a supporting element and electrical or electronic functional components arranged on the supporting element; a fastening device configured to fasten the electrical device to a higher-level assembly; a heat sink core element having at least one face wall; and an external element connectable to the heat sink core element, wherein the heat sink core element forms a supporting structure of the electrical device on which supporting structure the fastening device is arranged, and wherein the external element is connectable to the heat sink core element such that the at least one electrical functional assembly is accommodated between the at least one face wall of the heat sink core element and the external element.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
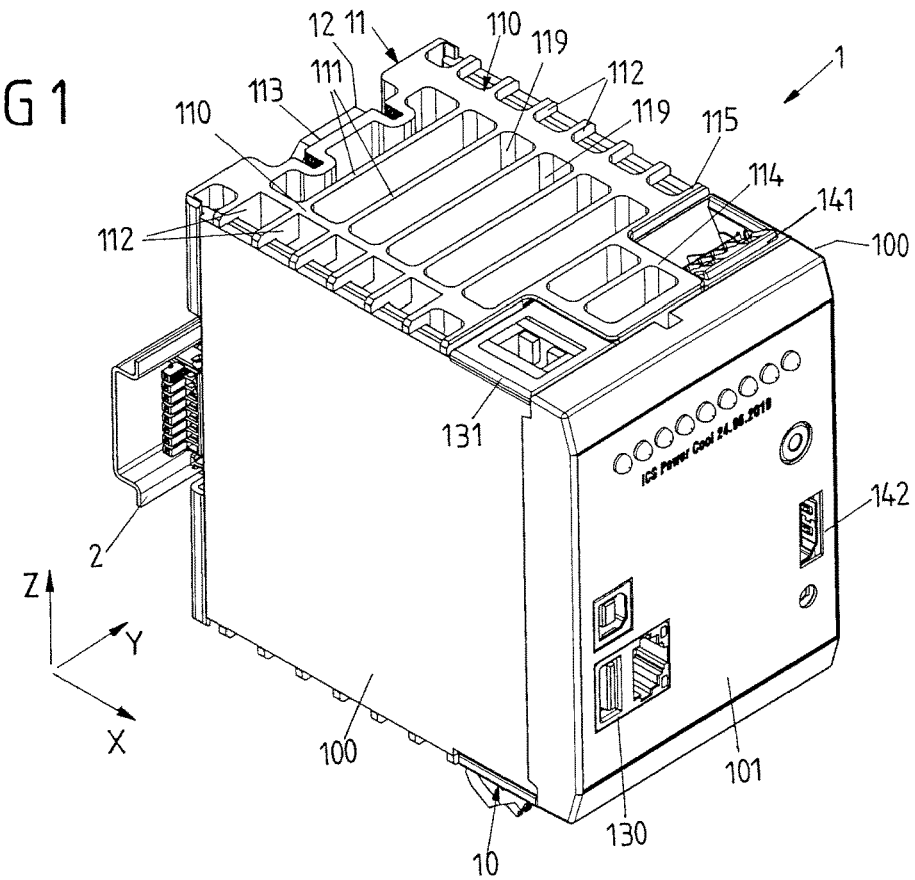
FIG. 1 a view of an exemplary embodiment of an electrical device with a heat sink forming a supporting structure.
Figure 2:
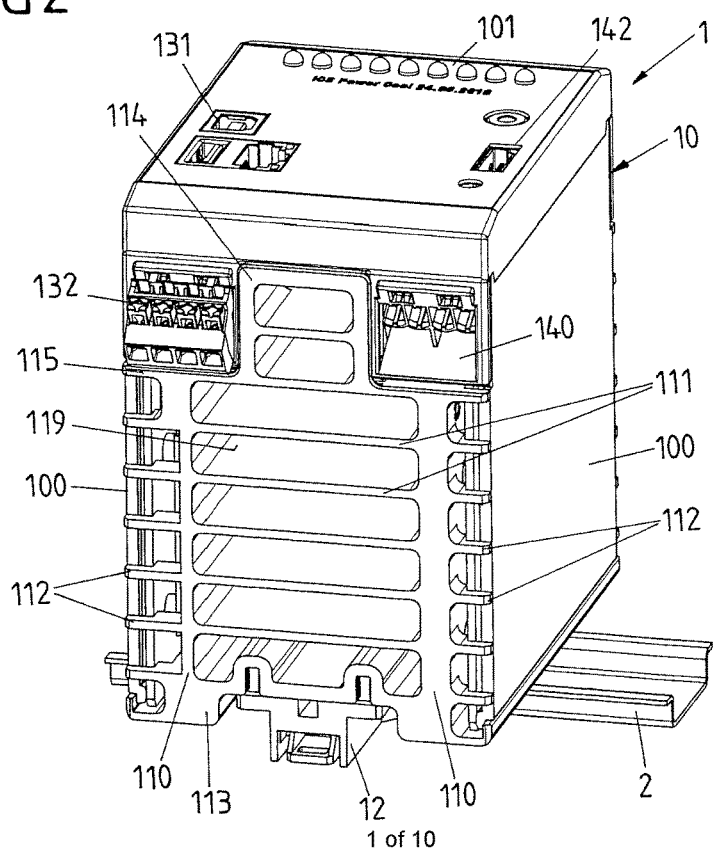
FIG. 2 another view of the electrical device.

In an embodiment, the present invention provides an assembly of an electrical device as well as a modular system and an electrical device, which, with a simple design, make a compact structure, an efficient assembly and a cost-effective production possible and can thereby provide efficient cooling of components on a printed circuit board.

Accordingly, the assembly comprises a heat sink core element having at least one face wall and an external element that can be connected to the heat sink core element, wherein the heat sink core element forms a supporting structure of the electrical device, on which supporting structure the fastening device is arranged, and the external element can be connected to the heat sink core element in such a way that the functional assembly is accommodated between the at least one face wall of the heat sink core element and the external element.

In conventional electrical devices, heat sinks are usually connected to an electrical functional assembly, for example a supporting element in the form of a printed circuit board of an electrical functional assembly, wherein the electrical functional assembly is enclosed in a housing and the housing provides a supporting structure for the electrical device. Usually, the housing is to be fastened to a mounting rail, for example by means of a fastening device arranged on the housing, so that an assembly, in particular a printed circuit board with a heat sink fastened thereto, enclosed in the housing can be held on the mounting rail via the housing.

As a departure from such a conventional concept, it is proposed in the present case to form the supporting structure of the electrical device through a heat sink core element. The heat sink core element thus not only takes on a function for heat absorption and heat dissipation from an electrical functional assembly but itself provides a supporting frame for the electrical device. In this case, an additional housing can possibly be dispensed with. In any case, it is not necessary for an essential supporting function to be taken on by a housing but for the supporting structure of the electrical device to be provided by the heat sink core element.

The heat sink core element has one or more face walls on which one or more electrical functional assemblies can be arranged. Such face walls, also referred to as the base wall or base of the heat sink core element, extend in a planar manner. The electrical functional assemblies can be fastened to the face walls in such a way that each electrical functional assembly is structurally held on an associated face wall and, in addition, heat generated at an electrical functional assembly can be absorbed via the face walls and dissipated via the heat sink core element.

For example, the heat sink core element can have a plurality of face walls, to each of which one or more electrical functional assemblies can be fastened. The face walls can, for example, form outer shell surfaces of the heat sink core element so that electrical functional assemblies can be arranged on the outside of the heat sink core element on the face walls in order to secure the electrical functional assemblies to the heat sink in this way and to thereby provide the electrical device.

In this case, at least one functional assembly, in the mounted position, is enclosed between an associated face wall of the heat sink core element and an external element attached to the heat sink core element and extending in parallel to the face wall, so that the functional assembly, for example comprising a printed circuit board with electrical or electronic functional components arranged thereon, is accommodated between the face wall of the heat sink core element and the external element. A kind of sandwich structure is thus created in which the heat sink core element forms an inner supporting structure of the electrical device and carries a functional assembly on a planar face wall, wherein this functional assembly is in turn covered on the outside by the external element extending in a planar manner in parallel to the face wall and is thus sandwiched between the face wall of the heat sink core element and the external element.

In one embodiment, profile elements, also referred to as offsets, for establishing a heat-conducting connection with the functional assembly arranged on the face wall can be arranged on the (at least one) face wall. Such profile elements can, for example, be elevations arranged on the face wall, which elevations extend from the face wall toward the functional assembly and serve to absorb heat at the functional assembly. Such profile elements can be integrally formed on the face wall, for example by milling. However, such profile elements can also be formed as additional elements on the face wall, for example by gluing or by additive manufacturing on the face wall.

The external element can, for example, be an outer housing wall that areally covers the functional assembly on the outside. However, as explained below, the external element can also be an additional heat sink part so that the functional assembly is sandwiched between the inner heat sink core element and the outer heat sink part and heat can thus be absorbed and dissipated on both sides of the functional assembly.

The heat sink core element in this case out the supporting structure for the electrical device and in particular carries the fastening device via which the electrical device can be fastened to a higher-level assembly. As explained in more detail below, the fastening device can be designed, for example, for arranging the electrical device on a mounting rail so that the electrical device can be mounted, for example, in a switchgear cabinet via the fastening device. Alternatively, the fastening device can be designed, for example, as a mounting plate or the like for attachment to a higher-level assembly, for example to a wall of a switchgear cabinet or the like, wherein a threaded connection can be established, for example, via the fastening device.

One or more functional assemblies can, for example, be arranged on the outside of one or more face walls. However, it is additionally also possible to insert an electrical functional assembly into a plug-in unit within the heat sink core element, for example, and to thus accommodate the electrical functional assembly within the heat sink core element, wherein the electrical functional assembly is in turn preferably arranged in the region of a face wall so that heat can be absorbed and dissipated at the face wall.

In one embodiment, the heat sink core element has two face walls which are arranged opposite one another and extend in parallel to one another, wherein electrical functional assemblies can be fastened to sides of the two face walls facing away from one another. One or more electrical functional assemblies can thus in each case be arranged on opposite face walls of the heat sink core element in order to connect the electrical functional assemblies to the heat sink in this way.

Cooling ribs are formed, for example, between the opposite face walls. For example, a convection flow can flow between the face walls so that heat can be absorbed at the cooling ribs between the face walls and dissipated by means of the convection flow.

External elements, for example in the form of housing walls or in the form of further heat sink parts, can in each case be arranged on the outside of the face walls of the heat sink core element extending in parallel to one another, so that functional assemblies are sandwiched between the heat sink core element and the respective externally arranged external elements at the face walls.

In one embodiment, the heat sink core element has a cuboid shape in order to form a cuboid supporting structure. For this purpose, the heat sink core element can, for example, have four face walls which are arranged at right angles to one another so that the face walls form a cube on the outer sides of which one or more electrical functional assemblies can in each case be arranged.

A functional assembly can here be arranged on each of the face walls, wherein during the production of the device, a functional assembly also need not necessarily be arranged on each face wall, but at least one receptacle is formed on the face walls and can serve to accommodate a functional assembly. In the mounted position, an external element is arranged in this case at least on one of the face walls so that a functional assembly can be sandwiched between the face wall and the external element on the respective face wall. However, such an external element must not absolutely necessarily be provided on all face walls.

In one embodiment, the at least one electrical functional assembly can be fastened to a first side of an associated face wall. Cooling ribs are formed on a second side of the face wall facing away from the first side. The electrical functional assembly can extend with its supporting element, which is formed, for example, by a printed circuit board, in parallel to the face wall and can be arranged so as to directly abut against the face wall or at a distance from the face wall. Heat can be absorbed via the face wall at the electrical functional assembly and conducted in the direction of the cooling ribs, wherein, for example, a convection flow can flow along the cooling ribs in order to absorb heat at the cooling ribs and dissipate heat from the heat sink.

In one embodiment, the heat sink core element has at least one flow shaft which is shaped in such a way that a convection flow can flow through the heat sink core element. When the heat sink core element is arranged as intended, for example when an associated electrical device is fastened to a mounting rail, the flow shaft can extend, for example, along a vertical direction corresponding to the direction of gravity, so that a convection flow can flow vertically through the heat sink core element. If the heat sink core element has, for example, a cube shape, the flow shaft is formed centrally within the heat sink core element so that a convection flow can flow through the inside of the heat sink core element in order to absorb heat inside the heat sink core element and dissipate it. Electrical functional assemblies can in this case be arranged on face walls on the outside of the heat sink core element or in plug-in units within the heat sink core element, wherein heat can be absorbed at the electrical functional assemblies and conducted inward in the direction of the flow shaft in order to dissipate heat within the flow shaft through a convection flow.

Cooling ribs can, for example, project into the flow shaft so that heat can be efficiently absorbed within the flow shaft by a convection disturbance.

The flow shaft can be directed vertically along the direction of gravity when the electrical device is oriented and used as intended, but this is not absolutely mandatory. The flow shaft can, for example, also be directed horizontally and thus transversely to the direction of gravity.

In order to generate a fluid stream through the flow shaft, an active fan, for example an electrically operated fan, can, for example, also be provided in order to convey a fluid stream, in particular an air stream, through the flow shaft.

Additionally or alternatively to a flow shaft, active cooling may be provided on the heat sink, for example by forming on the heat sink a coolant line to be flowed through by a coolant, for example a liquid or gaseous fluid.

Cooling ribs on the at least one face wall can, for example, extend in parallel to one another and project from the face wall, for example, in the direction of the flow shaft. However, cooling ribs can also run transversely or obliquely to a face wall, wherein within the flow shaft a plurality of cooling ribs can together form, for example, a honeycomb shape or a star shape or another geometry, for example.

While cooling ribs project into the flow shaft and are thus formed on the inside of an associated face wall, electrical functional assemblies, for example on the outside of the heat sink core element, can be fastened to external face walls of the heat sink core element so that heat can be conducted via the heat sink core element from the electrical functional assembly inward in the direction of the cooling ribs and the flow shaft.

In one embodiment, the assembly has an end-wall element made of an electrically insulating material, which can be connected to the heat sink core element and serves for the end-face covering of the heat sink core element. In particular, the end-wall element can have at least one flow opening for a fluid stream and can be designed to at least partially cover the heat sink core element in the region of the flow shaft. A cover of the heat sink core element can thus be provided in the region of the flow shaft by means of the end-wall element so that the heat sink core element is not exposed to the outside but is covered by the end-wall element.

Electrical and/or thermal insulation can also be provided by the end-wall element so that a user who touches the electrical device does not come into direct contact with the heat sink core element and is protected from electrical and/or thermal action. The end-wall element can thus provide electrical and/or thermal insulation and also a visual cover for the heat sink core element.

In one embodiment, the external element is formed by an additional heat sink part which can be connected to the heat sink in order to accommodate an electrical functional assembly between the heat sink part and the heat sink. While the heat sink core element can have, for example, a cubic shape which forms a core of the electrical device, the additional heat sink part can, for example, be arranged on the outside of a face wall of the heat sink core element so that an electrical functional assembly fastened to the face wall is at least partially covered on the outside by the heat sink part. Via the heat sink part, heat can also be absorbed and dissipated on the outside of the electrical functional assembly, wherein the heat sink part may be mechanically and also thermally coupled to the heat sink core element so that via the heat sink part, heat can both be dissipated to the outside and conducted to the heat sink in order to dissipate heat from the electrical functional assembly. Since, for example, the heat sink part is arranged on the outside and the heat sink core element is arranged on the inside of an associated electrical functional assembly, heat can be efficiently absorbed at the electrical functional assembly and dissipated from the electrical functional assembly.

For example, an additional heat sink part can be arranged in each case on some or on all face walls of the heat sink core element so that at the face walls of the heat sink core element, one or more electrical functional assemblies can be covered and enclosed, at least in sections, on the outside by a heat sink part.

In another embodiment, however, the external element can also be formed by a housing wall of a housing enclosing the heat sink core element. The housing wall can be connected to the heat sink core element in order to accommodate the at least one electrical functional assembly between the at least one face wall and the housing wall. The housing wall thus covers, on the outside, the heat sink core element in the region of the face wall carrying the functional assembly and can be made, for example, from an electrically and/or thermally insulating material. In addition, the housing wall provides a visual closure for the heat sink core element toward the outside so that the functional assembly on the heat sink core element is not visible from the outside.

In one embodiment, the external element is floatingly connected to the heat sink core element such that the external element can be moved at least along one spatial direction in relation to the heat sink core element. The external element can, for example, be movable perpendicularly to the face wall of the heat sink core element so that the connection of the external element to the face wall of the heat sink core element is designed with play along a normal direction relative to the face wall. Alternatively, the external element can also be movable tangentially, i.e., in the plane of the face wall, relative to the face walls, i.e., be connected to the face wall with play. Such a floating attachment can compensate for tolerances and position changes, for example due to thermal expansion.

The assembly has a fastening device for fastening the electrical device to a higher-level assembly, for example a mounting rail, wherein the fastening device can be integrally formed on the heat sink core element or can be fastened to the heat sink core element as a modular element.

Instead of a fastening device for fastening the electrical device to a mounting rail, however, the heat sink core element can also have another fastening device for fastening the electrical device to another fastening assembly, for example a mounting surface of a switchgear cabinet or the like, so that the electrical device can be configured modularly by selecting a suitable fastening device in order to secure the electrical device to a fastening wall, for example of a switchgear cabinet, to a mounting surface or to another associated supporting base.

The fastening device for fastening to the higher-level assembly can generally be designed for fastening to a mounting rail, to a mast, to a rod, or also to a wall. The electrical device is mounted and supported on the higher-level assembly via the fastening device. In this case, different fastening devices can be designed for fastening to different mounting rails (according to different industrial standards). A fastening device for fastening to a rod or a mast can be designed, for example, in the manner of a clamp. A fastening device for fastening to a wall can be designed, for example, as a screw-on holding plate or a bracket. In addition, the fastening device can be designed for connection to a supporting assembly, for example a stand, and enable for this purpose a VESA fastening, for example.

The fastening device may optionally be attachable to the heat sink core element in different orientations so that the electrical device can be connected to the higher-level assembly in different orientations via the fastening device.

In one embodiment, the supporting element of the at least one electrical functional assembly is formed by a printed circuit board. Electrical and electronic functional components in the form of electrical components or electronic components can be arranged on such a printed circuit board and together with the printed circuit board form the electrical functional assembly. A respective electrical functional assembly can be arranged via the printed circuit board on an associated face wall of the heat sink core element, wherein the heat sink core element forms a supporting structure of the electrical device and during operation, heat can be introduced into the heat sink core element from the electrical functional assembly and dissipated via the heat sink core element.

The electrical functional assembly can be formed by a printed circuit board having electrical or electronic components arranged thereon. In this case, the functional assembly can also have, for example, a plurality of printed circuit boards which are functionally connected to one another. For example, the functional assembly can have a main circuit board, also referred to as a motherboard, to which a further printed circuit board, for example in the form of a so-called SOM board, can be connected. Such an SOM board (SOM: system on a module) can provide a modular electronic functional component which can be connected, for example, in a plug-in manner to the main circuit board and exchanged in order to configure the electrical device.

In one embodiment, a plurality of bearing sections to which the supporting element of the at least one electrical functional assembly can be fastened are formed on the at least one face wall. The bearing sections can, for example, be formed by studs or ribs that are integrally formed on the face wall and hold the functional assembly in the intended position in relation to the face wall. By providing such bearing sections, a tolerance-insensitive arrangement of the functional assembly on the face wall can be made possible, in particular with regard to tolerances in the fastening of the electrical or electronic functional components to the supporting element.

In particular, a defined position of the supporting element of the functional assembly, for example of the printed circuit board, in relation to the face wall can be set via the bearing sections. Via the bearing sections, the supporting element is arranged in a fixed position at a distance from the at least one face wall so that the supporting element is held in a defined position from the face wall.

For example, bearing sections in the form of rib sections, which form support edges on which the supporting element of the at least one electrical functional assembly can be fastened, are formed on the at least one face wall. Via such rib sections, which project outward from the face wall, for example, the electrical functional assembly, in particular the supporting element of the electrical functional assembly, can be mounted at a prespecified distance from the face wall so that the supporting element of the electrical functional assembly comes to rest at a distance from the face wall. The electrical functional assembly thus assumes a defined position in relation to the face wall and is supported with respect to the face wall via the support edges formed on the rib sections.

As an alternative to such rib sections formed on a face wall, spacer sleeves or other spacer elements can also be provided, which keep the supporting element of an electrical functional assembly at a distance from an associated face wall.

In one embodiment, the heat sink core element is manufactured integrally and in one piece from a thermally conductive material, for example a metal material, in particular a copper, aluminum, or zinc material. The heat sink core element can be formed, for example, from a continuously cast profile, for example an aluminum continuously cast profile. Alternatively, the heat sink core element can also be milled from one piece. The heat sink core element may, for example, be adapted to the electrical device in that, for example, cleared regions for accommodating components arranged on, for example, a printed circuit board are milled into the heat sink core element.

Alternatively, the heat sink core element can also be formed in several pieces (in the initial state) from a thermally conductive material composite. The heat sink can be produced, for example, by plate-shaped elements which are connected to one another in a thermally conductive manner in order to create a thermally conductive composite consisting of individual plates.

According to a further aspect, a modular system of an assembly of the type described above is provided. The modular system comprises a group of different heat sink core elements and a group of different external elements, each connectable to the heat sink core element. In order to produce the electrical device, a user can select one of the heat sink core elements and one or more of the external elements in order to configure the electrical device in this way and to produce it by mounting the external elements with the heat sink core element.

A modular system is thus created in which the electrical device can be configured in a flexible manner by selecting components. For example, heat sink core elements can have different widths, measured for example along the longitudinal extension direction of a mounting rail, so that electrical devices of different widths can be created. Depending on, for example, a power class, the dimension of the heat sink core element can thus be varied, wherein, independently of, for example, the width of the heat sink core element, identical external elements can be connected to the heat sink core element, and a module for producing the electrical device is thus created.

In the modular system, the external elements can, for example, be heat sink parts and housing walls. The electrical device can thus optionally be configured in such a way that external elements in the form of further heat sink parts or in the form of side walls can be attached to a heat sink core element.

An end-wall element can, for example, also be part of the modular system, wherein the electrical device can optionally be produced with or without an end-wall element.

One or more modular fastening devices that can be combined with the different heat sink core elements can also be part of the modular system. The fastening devices can be designed, for example, for fastening to a mounting rail, to a mast, to a rod, or to a wall.

A fastening device can optionally also be integrally formed on the heat sink core element, wherein different heat sink core elements can have different fastening devices.

According to a further aspect, in an electrical device, one or more electrical functional assemblies are connected to one or more face walls of the heat sink core element. Electrical or electronic functional components of an electrical functional assembly can in this case be arranged on a side of the supporting element of the electrical functional assembly facing an associated face wall and/or on a side of the supporting element facing away from the associated face wall. Electrical or electronic functional components can be arranged on one side or on both sides of the supporting element, for example formed by a printed circuit board. In this case, the electrical or electronic functional components can face the respectively associated face wall of the heat sink core element or face away from the face wall.

During the production of the electrical device, a thermal contact force, in particular between the heat sink core element, the external element, and the functional assembly arranged between them, can be automatically set, for example by joining when creating a threaded or adhesive connection or possibly via a spring force in the support of the parts relative to one another.

When the electrical functional assembly has been mounted, the supporting element extends, for example, substantially in parallel to an associated face wall so that the supporting element of the electrical functional assembly extends in a planar manner along the associated face wall.

If electrical and/or electronic functional components are arranged on both sides of the supporting element, for example in the form of the printed circuit board, then heat can be absorbed and dissipated at the functional components on both sides of the supporting element via the inner heat sink core element and the external element, for example in the form of a further heat sink part, that covers the face wall at least in sections and that is connected to the heat sink core element on the outside. This enables cooling by absorbing and dissipating heat on both sides of the supporting element. Since the functional assembly is sandwiched between the heat sink core element and the associated external element, in particular in the form of a further heat sink part, efficient cooling of the components is thus possible even with high heat generation.

In one embodiment, the heat sink core element is thermally connected to one or more functional components on one or more supporting elements via one or more heat-conducting connections. The heat-conducting connections establish a thermal coupling of a heat-producing component, for example an electronic processor or the like, to the heat sink core element.

The heat-conducting connections can, for example, be integrally formed with the heat sink core element and, for example, project in the shape of studs from a supporting wall of the heat sink core element in order to couple thermally to the respectively associated component. Such a heat-conducting connection can, for example, extend through an opening in the supporting element, for example in the form of a printed circuit board, in order to establish a thermal coupling with a component on a side of the printed circuit board facing away from the heat sink core element.

The heat-conducting connection can, for example, be coupled to a functional component of an electrical functional assembly via a heat-conducting layer, for example in the form of a heat-conducting paste, wherein the functional component is, for example, arranged on a side of the supporting element of the electrical functional assembly facing away from the face wall and is thermally coupled to the face wall via the heat-conducting connection through the supporting element but is electrically connected to the side of the supporting element facing away from the face wall, for example in that electrical connections between the functional component and conductor tracks of the supporting element are created on the side of the supporting element facing away from the face wall.

Such a heat-conducting connection can also be created via an additional element connected to the heat sink core element, for example via a joining technique (for example by gluing), wherein the heat-conducting connection in turn establishes a thermal coupling between a component on a printed circuit board and the heat sink core element.

In particular, a functional component in the form of an SOM board can be thermally connected via such a heat-conducting connection. The SOM board can, for example, be arranged on an outer side of the supporting element facing away from the heat sink core element, wherein a rear thermal connection to the heat sink core element is effected via the heat-conducting connection.

In the electrical device, the supporting structure is provided by the heat sink core element itself. In addition, a housing that is for example, electrically insulating and that surrounds the heat sink core element toward the outside can be arranged on the heat sink core element, wherein the housing is supported via the heat sink core element and can be fastened, for example, to an associated mounting rail or another supporting base via the heat sink core element. The housing thus advantageously assumes no supporting function itself.

The electrical device can have connections for connecting electrical lines. For this purpose, plug-in connector modules to which associated mating plug-in connectors can be connected can be attached to one or more printed circuit boards.

Connections can additionally or alternatively be attached to an upper part, for example a plastic molded part, which is fastened to the heat sink core element.

A printed circuit board of the electrical device can, for example, have embedded components (a so-called "embedded PCB"). For example, the printed circuit board can be formed by a so-called SOM board (SOM stands for "system on a module") or can be connected to such an SOM board.

The electrical device may have different power classes and may in this respect be scalable. The electrical device can also have different form factors.

An electrical device of the type described can be designed in particular for application in the field of communication technology, in particular 5G, in the field of edge computing, or in the field of the so-called Industry 4.0.

FIGS. 1 to 4 show an exemplary embodiment of an electrical device 1 which can be arranged together with other electrical devices on a mounting rail 2 in order to, for example, provide evaluation and control functions, for example for evaluating sensor signals and/or for controlling actuators or the like, in a switchgear cabinet by a variable combination of different electrical devices.

Electrical devices can in this case be lined up next to one another along a transverse direction Y and fastened to the mounting rail 2 in order to create an arrangement of electrical devices on the mounting rail 2.

In the electrical device 1, a supporting structure is created by a heat sink core element 11 which forms a core of the electrical device 1 and to which electrical functional assemblies in the form of printed circuit boards 13-16 with electrical or electronic functional components 18 arranged thereon are secured. The heat sink core element 11 is made of a highly thermally conductive material, in particular a metal material, for example a copper, aluminum, or zinc material, and can, for example, take the form of a continuous cast profile, for example an aluminum continuous cast profile.

The heat sink core element 11 can be adapted to a specific use, for example by milling, in particular to a specific arrangement of printed circuit boards 13-16, for example in order to create cleared regions in the heat sink core element 11 where components of the printed circuit board 13-16 can be accommodated.

In the electrical device 1 of the exemplary embodiment according to FIGS. 1 to 4, the heat sink core element 11 forms the supporting structure of the electrical device 1. The heat sink core element 11 supports the printed circuit boards 13-16 and is also secured to the associated mounting rail 2 via a fastening device 12 so that the electrical device 1 is held on the mounting rail 2 via the heat sink core element 11 and the fastening device 12 arranged thereon.

The heat sink core element 11 has face walls 110 which extend in parallel to one another and are connected to one another via a rear supporting wall 113, a front supporting wall 115, and cooling ribs 111 extending between the face walls 110. Flow openings for forming a flow shaft 119 are formed between the cooling ribs 111 extending in parallel to one another, which flow openings are oriented along a vertically directed height direction Z when the electrical device 1 is connected as intended to an associated mounting rail 2 and thus enable a convection air stream through the heat sink core element 11 in order to dissipate heat from the heat sink core element 11.

With the face walls 110, 113, 115, the heat sink core element 11 forms a cube shape which can be modularly populated with electrical functional assemblies in the form of printed circuit boards 13-16 and electrical and/or electronic functional components 18 arranged thereon. When arranged on the mounting rail 2 as intended, the flow shaft 119 formed by the flow openings between the cooling ribs 111 is vertically oriented so that a convection flow can flow through the flow shaft 119 in order to absorb heat at the heat sink core element 11 and dissipate it.

Figure 3:
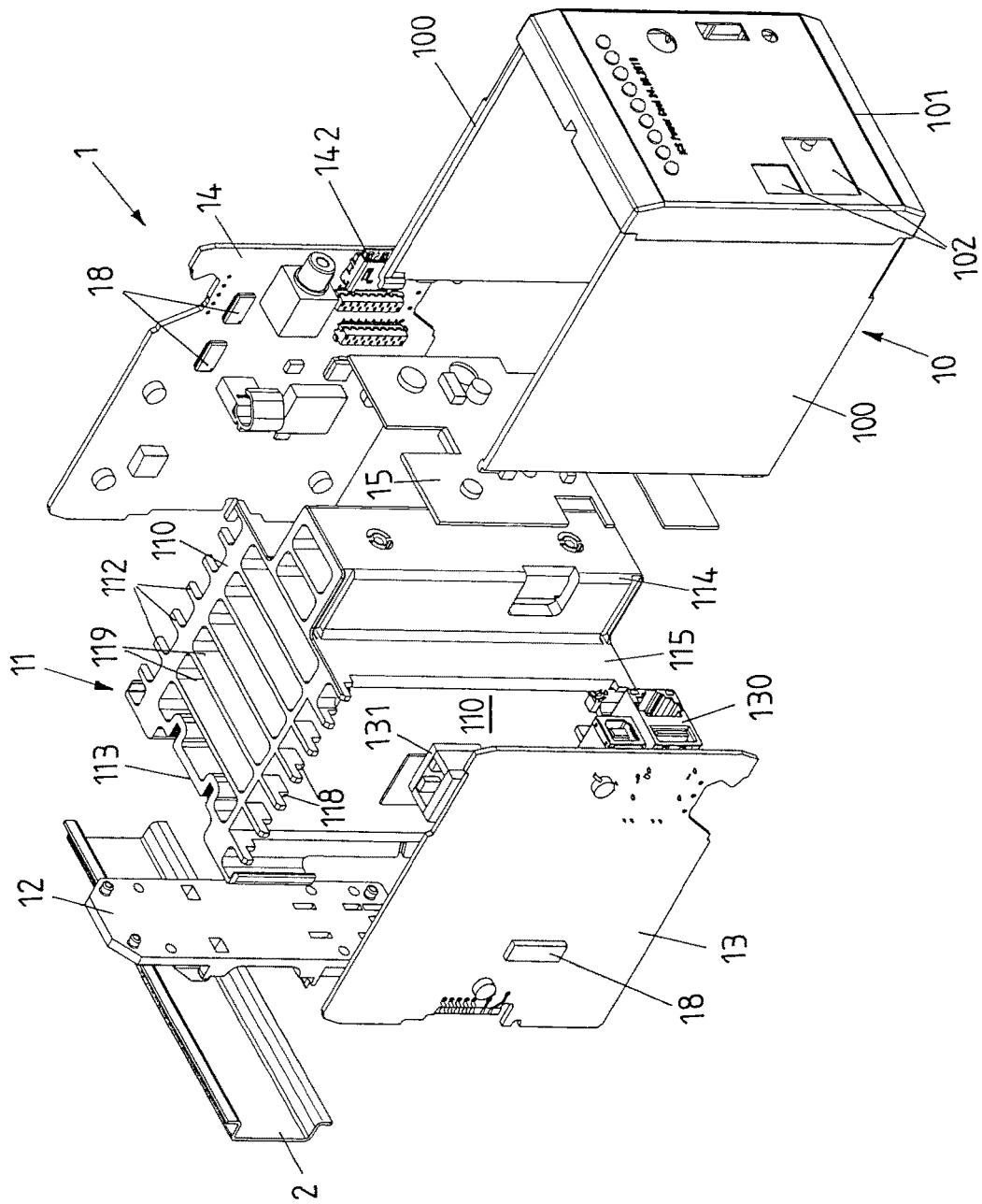
FIG. 3 an exploded view of the electrical device.

As shown in FIG. 3, an associated printed circuit board 13, 14 is arranged on the outside of each face wall 110. For this purpose, projecting rib sections 112 are formed on each face wall 110, which rib sections form support edges 118 and thus together provide a seat for a respectively associated printed circuit board 13, 14, via which seat the printed circuit board 13, 14 is supported at a distance from the associated face wall 110.

Figure 4:
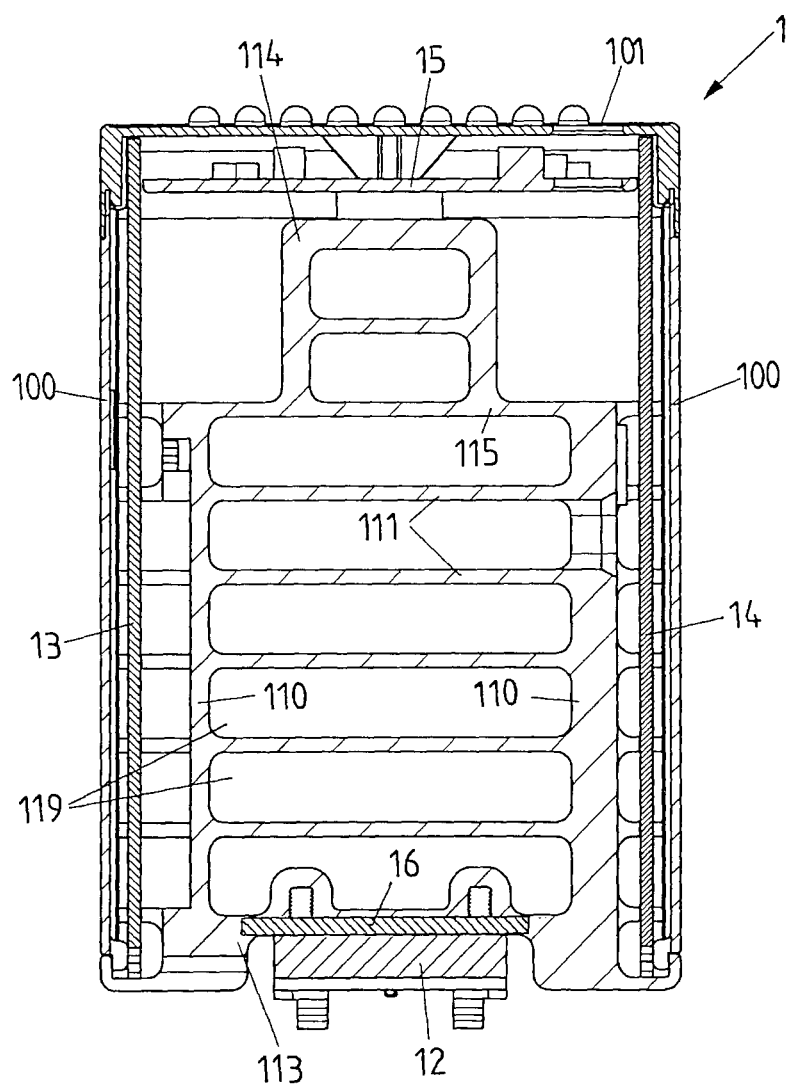
FIG. 4 a view of the electrical device from below.

In addition, a printed circuit board 15 is arranged in the region of the front supporting wall 115, as can be seen from FIG. 3 and is also illustrated in FIG. 4.

A body section 114 projects from the front supporting wall 115 along a longitudinal direction X directed away from the mounting rail 2, and cooling of components in the region of the front supporting wall 115 can be provided via said body section.

The fastening device 12 is firmly connected to the rear supporting wall 113 facing the mounting rail 2 and serves to establish a latching connection with the mounting rail 2. It is also conceivable in this case to form the fastening device 12, for example in the form of latching hooks, integrally with the rear supporting wall 113.

As shown in FIG. 4, a printed circuit board 16 can additionally also be arranged in the region of the rear supporting wall 113.

The face walls 110 extend in parallel to one another in a respective associated plane, which is spanned by the longitudinal direction X and the height direction Z. In contrast, the cooling ribs 111 each extend between the face walls 110, the rear supporting wall 113, and the front supporting wall 115 along an associated transverse plane, which is spanned by the height direction Z and the transverse direction Y extending transversely to the longitudinal direction X.

The printed circuit boards 13-16 carry electrical and/or electronic components on which heat can be generated during operation. Since the circuit boards 13-16 are firmly connected to the heat sink core element 11 and thermally coupled to the heat sink core element 11, heat can be introduced into the heat sink core element 11 during operation and dissipated via the heat sink core element 11, for example by dissipating heat through the heat sink core element 11 via a convection flow.

In the exemplary embodiment according to FIGS. 1 to 4, plug-in connector modules 130-132, 140-142, for example, are arranged on the printed circuit boards 13, 14, and electrical lines can be connected to the printed circuit boards 13, 14 and thus to the electrical device 1 via said plug-in connector modules. In addition, further components, for example a cover part, can be fastened to the printed circuit boards 13, 14.

In the exemplary embodiment according to FIGS. 1 to 4, the electrical device 1 is enclosed toward the outside by a housing part 10, which has external elements in the form of side walls 100 and a front wall 101 and is thus substantially U-shaped. The side walls 100 encompass the printed circuit boards 13, 14 at the face walls 110 on the outside, while the front wall 101 faces the front supporting wall 115 of the heat sink core element 11. The external elements in the form of the side walls 100 thus cover the printed circuit boards 13, 14 toward the outside at the face walls 110 in such a way that the functional assemblies in the form of the printed circuit boards 13, 14 with the electrical and/or electronic functional components arranged thereon are sandwiched between the respectively associated face wall 110 and the side wall 100.

The side walls 100 may, for example, be made of an electrically and thermally insulating material, for example a plastic material.

Alternatively, as additional heat sink parts, the side walls 100 can provide a cooling function by heat absorption and heat dissipation and, for this purpose, can be made, for example, of a highly thermally conductive material, for example a metal material, for example a copper, aluminum, or zinc material.

In the mounted position, at least some of the plug-in connector modules 130-132, 140-142 of the printed circuit boards 13, 14 lie in associated openings 102 on the front wall 101 of the housing part 10 so that lines can be connected to the electrical device 1 via the front wall 101 and additionally on the upper side and on the underside (for example, via the plug-in connector modules 131, 140).

In the exemplary embodiment shown in FIGS. 1 to 4, the housing part 10 itself has no supporting function. The supporting structure of the electrical device 1 is provided by the heat sink core element 11, by means of which the fastening to the mounting rail 2 is effected and to which the printed circuit boards 13, 14, 15, 16 are also secured. In this respect, the housing part 10 only provides a cover toward the outside.

Figure 5:
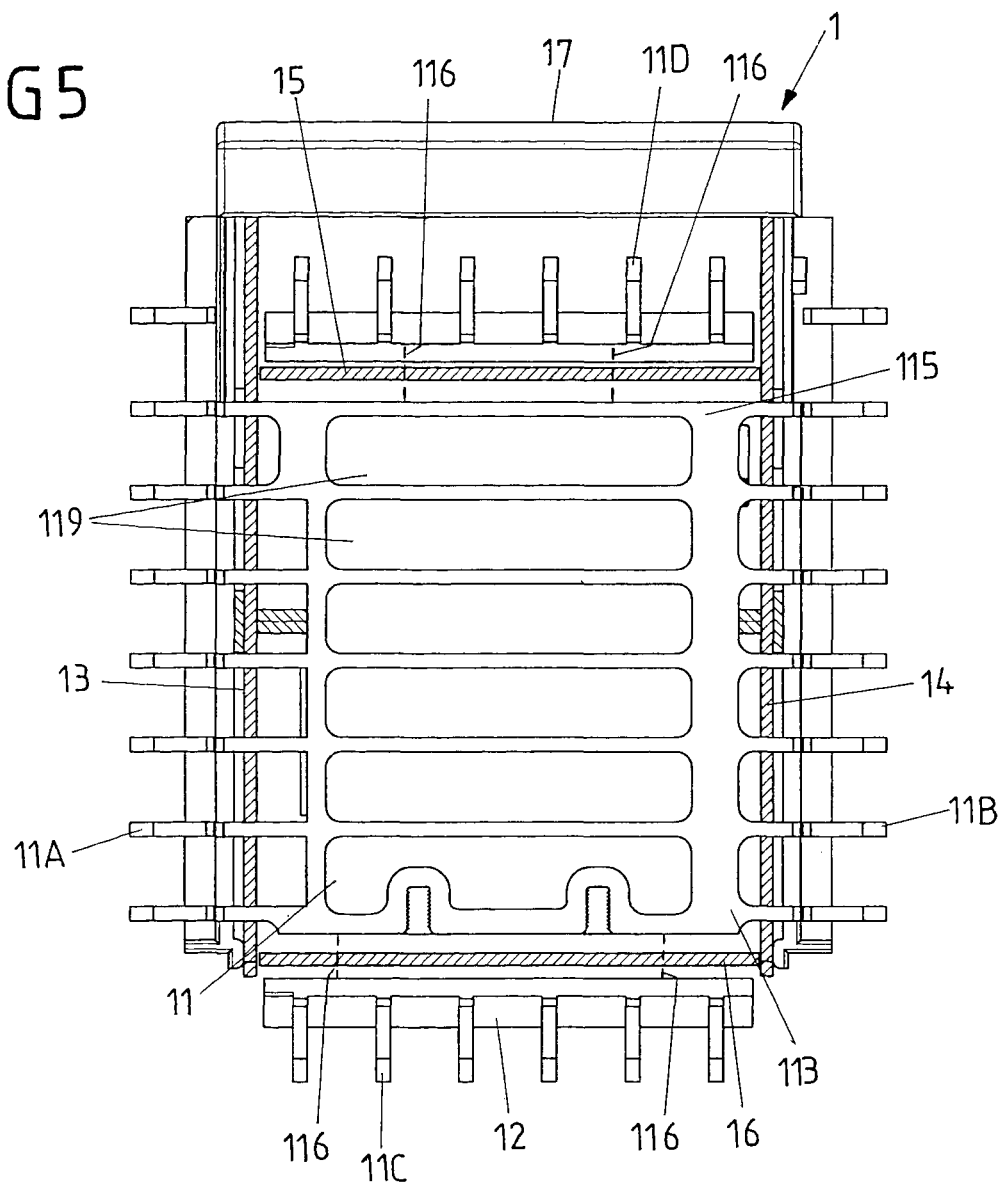
FIG. 5 a schematic view of an exemplary embodiment of an electrical device with a supporting structure formed by a heat sink core element.

In another embodiment shown schematically in FIG. 5, external elements in the form of additional heat sink parts 11A-11D can be attached to a heat sink core element 11 representing a central supporting structure, each external element having outward facing cooling ribs so that printed circuit boards 13, 14, 15, 16 are covered on lateral face walls 110, on a rear supporting wall 113, and on a front supporting wall 115 of the heat sink core element 11 by a respectively associated heat sink part 11A-11D. The printed circuit boards 13, 14, 15, 16 are thus in each case sandwiched between the heat sink core element 11 and an associated heat sink part 11A-11D connected to the heat sink core element 11, so that the printed circuit boards 13, 14, 15, 16 are enclosed on both sides.

Each heat sink part 11A-11D is structurally firmly connected to the heat sink core element 11 via connections 116, wherein thermal coupling may also be established via the connections 116 in addition to a mechanical connection.

In the exemplary embodiment according to FIG. 5, the fastening device 12 is arranged on a heat sink part 11C firmly connected to the rear supporting wall 113 and associated with the rear supporting wall 113, so that a connection to the mounting rail 2 can be established via the rear heat sink part 11C.

The fastening device 12 can optionally be exchanged on a modular basis and replaced by a fastening device for fastening the electrical device 1 to another mounting surface or supporting base.

The heat sink parts 11A-11D can each have a ribbed structure. The heat sink parts 11A-11D are made of a highly thermally conductive material, in particular a metal material, for example a copper, aluminum, or zinc material.

In the exemplary embodiment according to FIG. 5, a front part 17 is attached to the heat sink core element 11 and is, for example, connected to the heat sink core element 11 via the lateral heat sink parts 11A, 11B. Input and/or output functions can be provided on the electrical device 1 via the front part 17. Additionally or alternatively, electrical connections can also be arranged on the front part 17.

Since cooling ribs 111 extend between the lateral face walls 110 of the heat sink core element 11 in both the exemplary embodiment according to FIGS. 1 to 4 and the exemplary embodiment according to FIG. 5, a vertical convection flow can flow within the heat sink core element 11 through the flow shaft 119 formed by the flow openings in order to dissipate heat from the heat sink core element 11 in this way. Additionally or alternatively, active cooling can also be provided at the heat sink core element 11 and/or at the heat sink parts 11A-11D in that coolant lines are formed on the heat sink core element 11 and/or on the heat sink parts 11A-11D and a coolant can be conducted through said coolant lines in order to absorb heat at the electrical device 1 and dissipate it from the electrical device 1.

Figure 6:
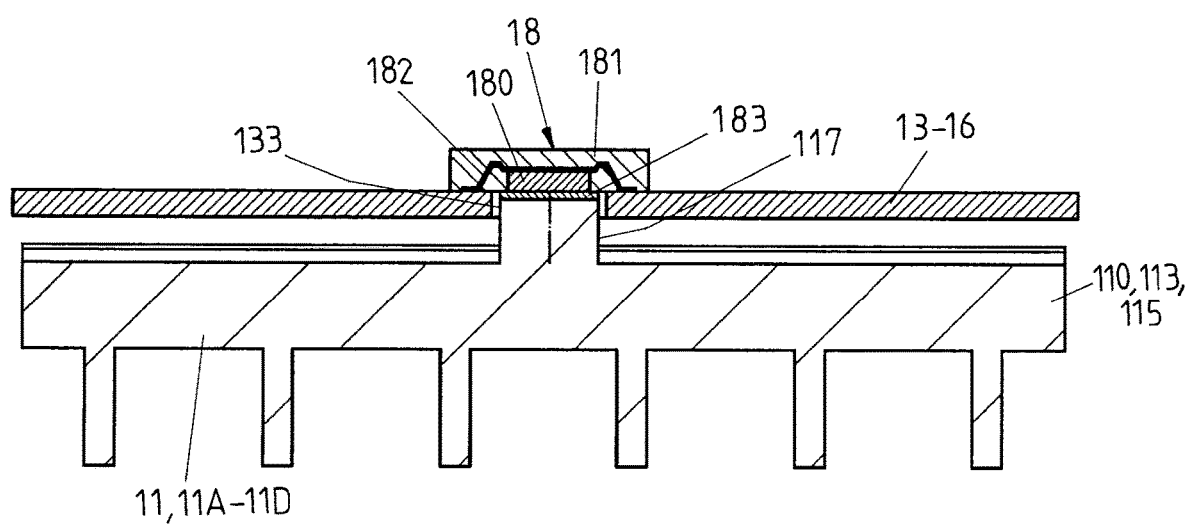
FIG. 6 a schematic view of a connection of a component of a printed circuit board to a heat sink.
Figure 7:
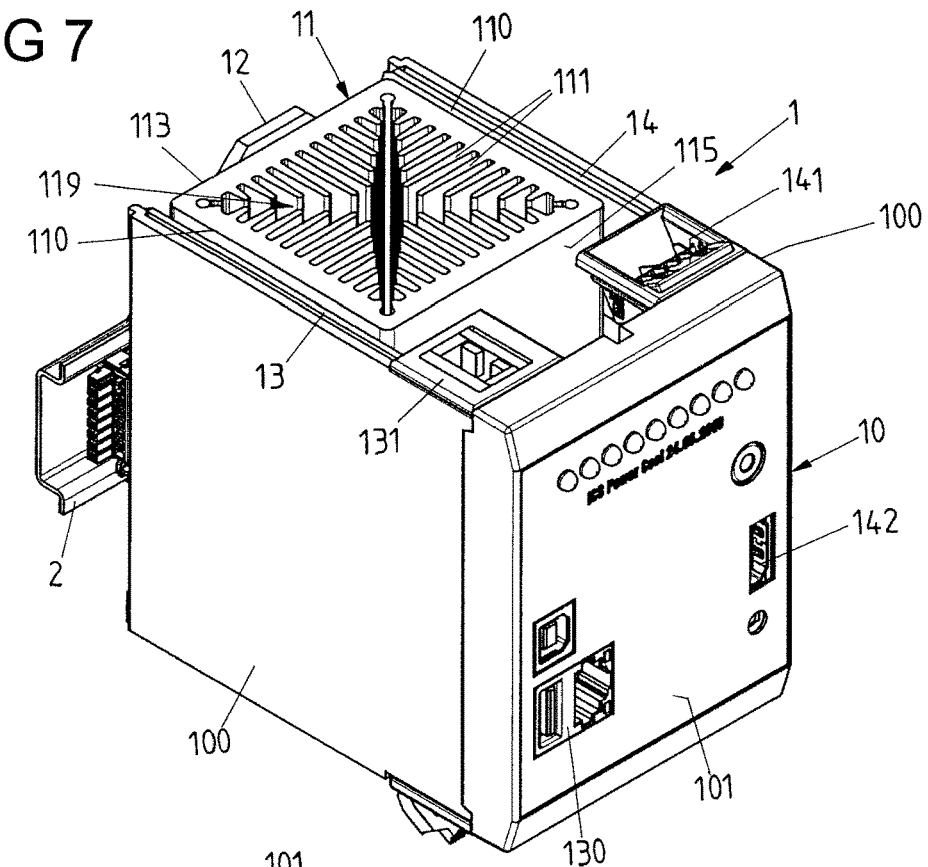
FIG. 7 a view of a further exemplary embodiment of an electrical device with a heat sink forming a supporting structure.
Figure 8:
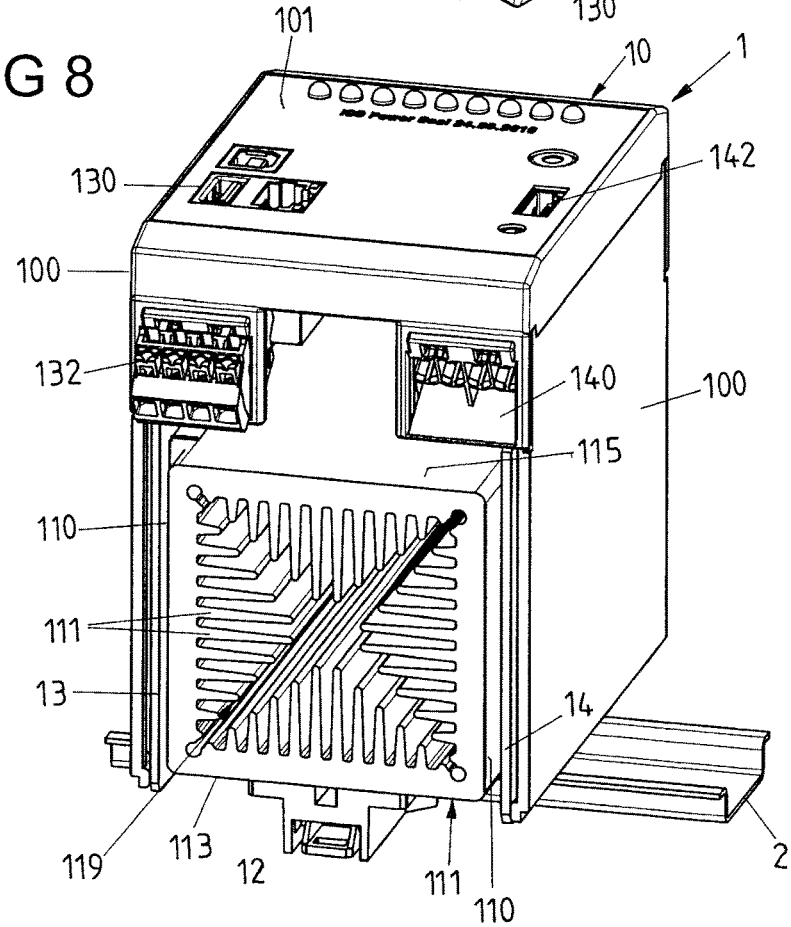
FIG. 8 another view of the electrical device.
Figure 9:
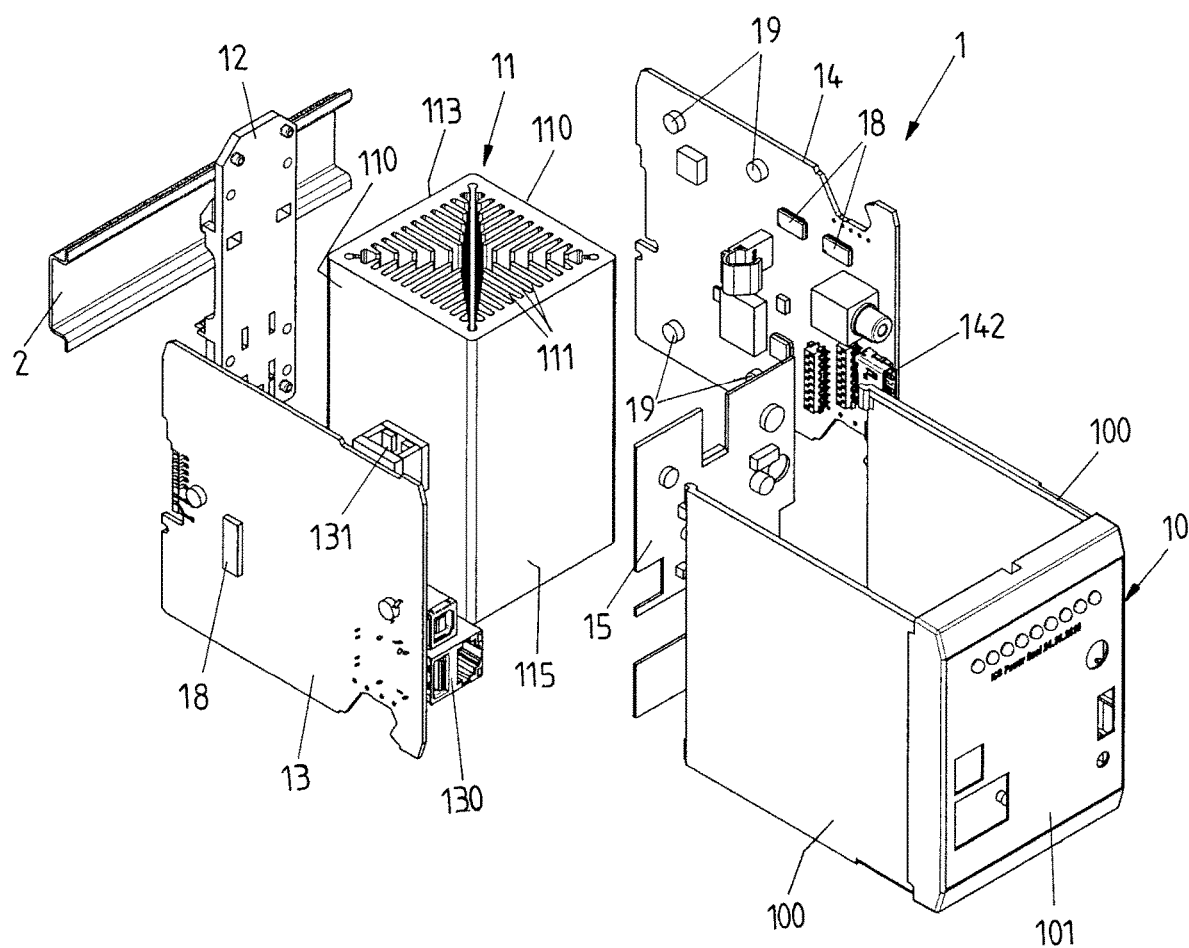
FIG. 9 an exploded view of the electrical device.

As shown in FIG. 6, the printed circuit boards 13-16 can carry electrical and/or electronic functional components 18, for example electrical components or electronic components, such as processors, on which heat can be generated during operation, which heat is to be dissipated via the heat sink core element 11 and/or the heat sink parts 11A-11D. The heat sink core element 11 and/or the heat sink parts 11A-11D can in this case be thermally connected to a respectively associated component 18 via heat-conducting connections 117 so that heat can be absorbed at the component 18 and dissipated.

Such a heat-conducting connection 117 can, for example, be integrally formed with the heat sink core element 11 or the heat sink parts 11A-11D in the form of a stud and can, for example, extend through an opening 133 in the printed circuit board 13-16 toward the component 18 arranged, for example, on a facing-away side of the printed circuit board 13-16. For thermal coupling, a heat-conducting layer 183, for example in the form of a heat-conducting paste or the like, can in this case be arranged between the heat-conducting connection 117 and an electrical or electronic component 180 of the functional component 18 so that an effective thermal transition for a heat-conducting connection between the component 180 and the heat-conducting connection 117 is created.

The component 180 can be encapsulated by an enclosure 181 on the side facing away from the face wall 110, 113, 115. Via electrical connections 182, the component 180 can in this case be connected to the printed circuit board 13-16 on the side of the printed circuit board 13-16 facing away from the face wall 110, 113, 115 so that the component 180 is electrically connected to the side of the printed circuit board 13-16 facing away from the face wall 110, 113, 115 and is connected, for example, to conductor tracks of the printed circuit board 13-16.

Instead of an integral formation with the heat sink core element 11 or the heat sink parts 11A-11D, a heat-conducting connection 117 can, for example, also be connected to the heat sink core element 11 or the heat sink parts 11A-11D using a joining technique, for example by means of gluing.

In an exemplary embodiment of an electrical device 1 shown in FIGS. 7 to 10, a heat sink core element 11, which forms a supporting structure of the electrical device 1, is designed as a cube with identical sides formed by face walls 110, 113, 115. In comparison to the exemplary embodiment according to FIGS. 1 to 4, the exemplary embodiment shown in FIGS. 7 to 10 is modified with regard to the design of the heat sink core element 11 but is otherwise substantially functionally identical so that reference is also made to the above statements relating to the exemplary embodiment according to FIGS. 1 to 4.

As shown in FIGS. 7 to 10, a printed circuit board 13-16 can be arranged on each of the face walls 110, 113, 115 so that electrical functional assemblies with printed circuit boards 13-16 and functional components 18 arranged thereon can be arranged in a modular manner on the face walls 110, 113, 115.

In the exemplary embodiment according to FIGS. 7 to 10, the heat sink core element 11 forms a cube which is bounded toward the outside by the face walls 110, 113, 115 and is open toward the top and the bottom (when viewed along a vertical direction which corresponds to the direction of gravity when the electrical device 1 is arranged as intended). On the inside of the face walls 110, 113, 115, cooling ribs 111 are formed which extend into a flow shaft 119 formed inside the heat sink core element 11 and which each project perpendicularly from an associated face wall 110, 113, 115, wherein cooling ribs 111 extending from the different face walls 110, 113, 115 are not connected to one another and a star-shaped opening thus results within the heat sink core element 11.

Analogously to the exemplary embodiment according to FIGS. 1 to 4, one printed circuit board 13-16 of an electrical functional assembly is attached to each face wall 110, 113, 115 in the exemplary embodiment according to FIGS. 7 to 10, wherein a printed circuit board 13-16 can optionally also be arranged only on individual ones of the face walls 110, 113, 115.

The printed circuit boards 13-16 of the electrical functional assemblies can be connected to the heat sink core element 11 via fastening elements 19 in the form of spacer elements arranged on the printed circuit boards 13-16, so that the printed circuit boards 13-16 are held at a distance from the associated face walls 110, 113, 115. A mechanical connection of the printed circuit boards 13-16 to the face walls 110, 113, 115 can be established via the spacer elements 19.

In addition, electrical and/or electronic functional components 18 can be thermally coupled to the heat sink core element 11 via heat-conducting connections 117, as shown in FIG. 6.

A fastening device 12 by means of which the electrical device 1 can be arranged on a mounting rail 2 can be arranged on a rear face wall 113. In this case, the fastening device 12 can be modularly connected to the face wall 113, possibly with the interposition of an electrical functional assembly having a printed circuit board 16 (see FIG. 10), wherein other fastening devices for fastening the electrical device 1 to a supporting base other than a mounting rail 2 can also be connected to the heat sink core element 11.

A housing 10 with housing walls 100, 101 can be attached to the heat sink core element 11 in order to create an enclosure for the electrical device 1. In this case, however, the housing 10 itself does not take on any supporting function, which is instead taken on by the heat sink core element 11.

Figure 10:
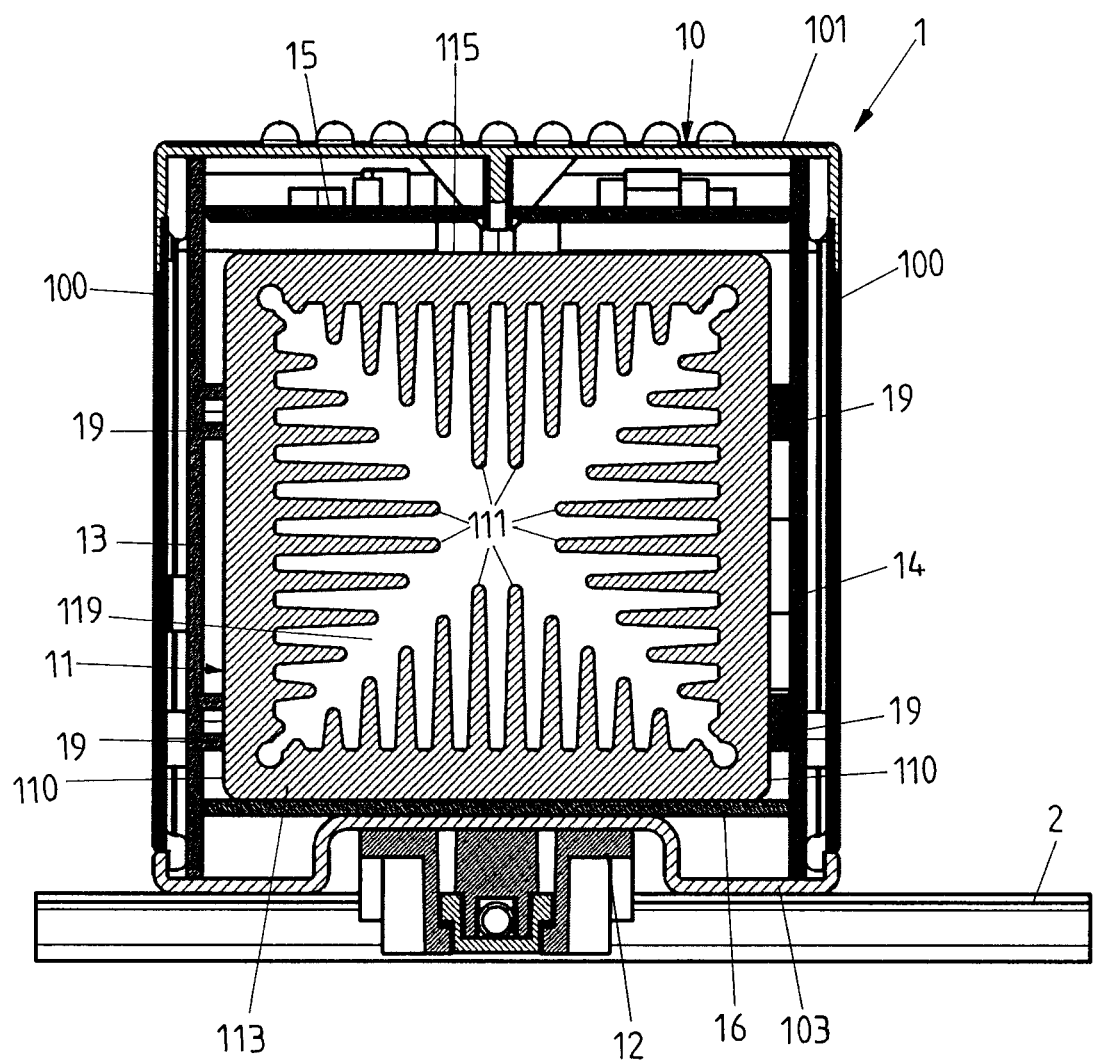
FIG. 10 a view of the electrical device from below.

As shown in FIG. 10, the rear face walls 113 connected to the fastening device 12 can also be covered, and thus encased toward the outside, by a wall section 103 of the housing 10.

Figure 11:
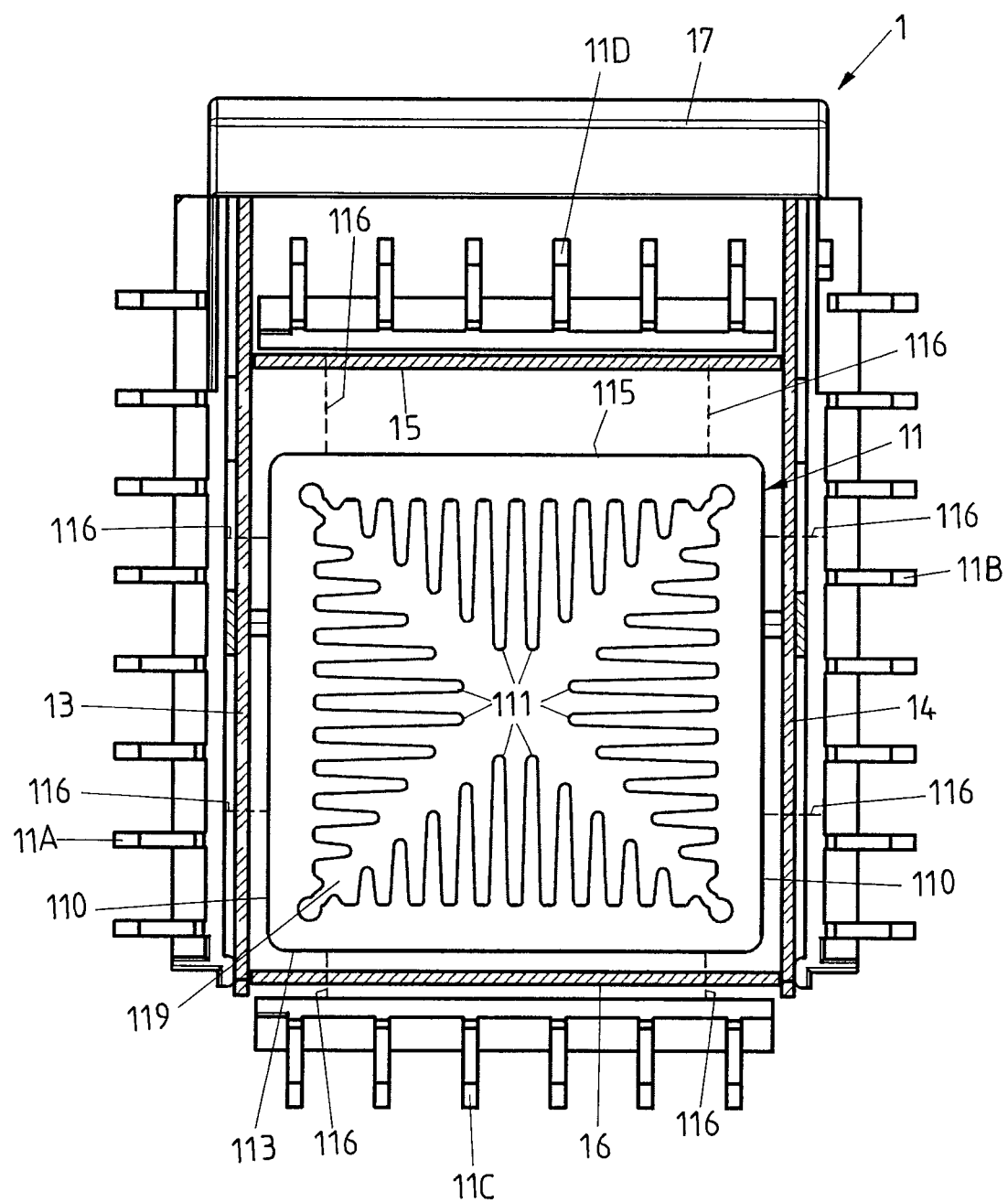
FIG. 11 a schematic view of another exemplary embodiment of an electrical device with a supporting structure formed by a heat sink core element.

As shown in an exemplary embodiment in FIG. 11, further heat sink parts 11A-11D can also be arranged on the outside in the case of the heat sink core element 11 according to FIGS. 7 to 10, and electrical functional assemblies with printed circuit boards 13-16 can be enclosed toward the outside and covered at least in sections via said heat sink parts. The heat sink parts 11A-11D can, analogously to what was described above with reference to FIG. 5, be mechanically and thermally coupled to the heat sink core element 11 via connecting devices 116 so that a contiguous supporting structure with the heat sink core element 11 as the central core is created.

Figure 12:
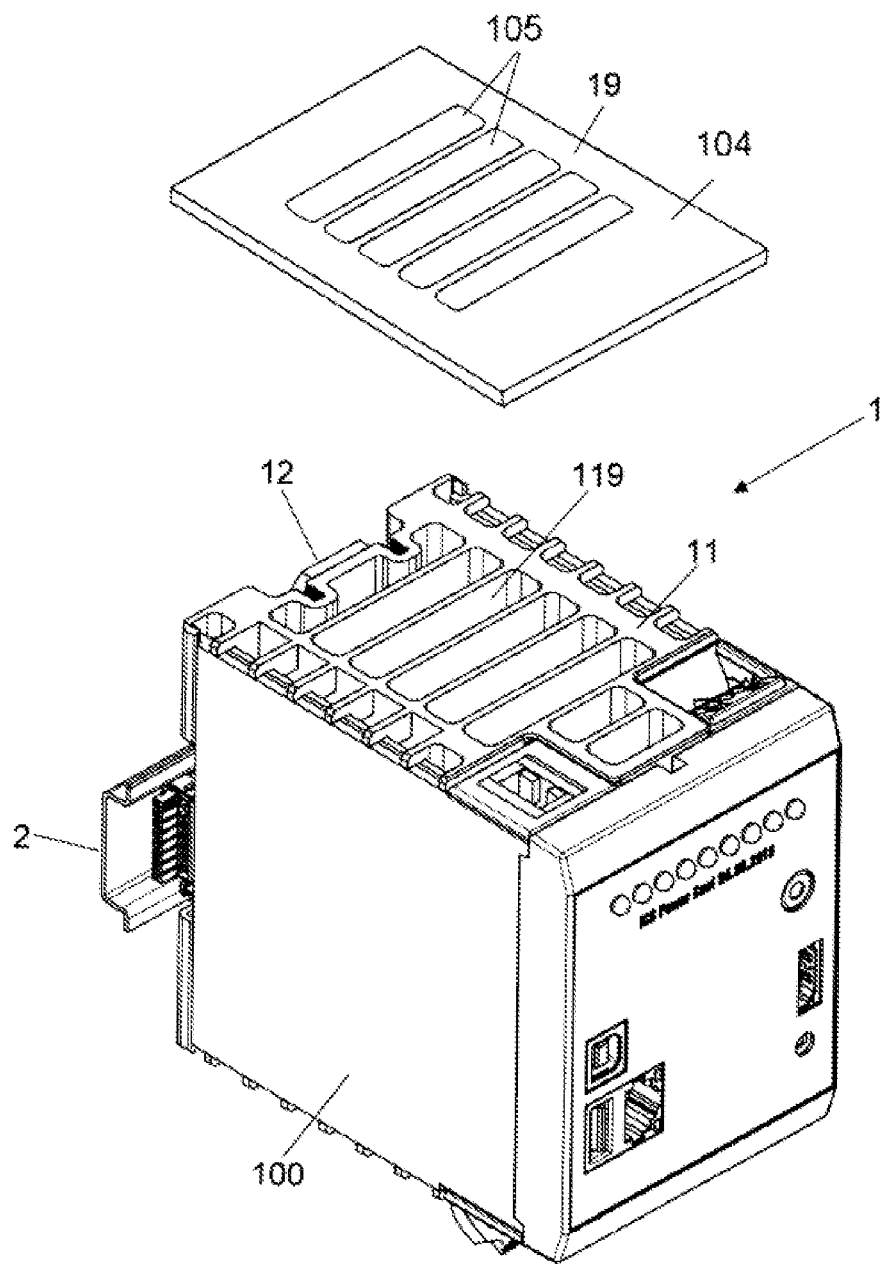
FIG. 12 the view according to FIG. 1, with an end-wall element for covering the end face of the heat sink core element.

In all of the preceding exemplary embodiments, as shown in FIG. 12 with reference to the exemplary embodiment according to FIG. 1, an end-wall element 104 may be attached at the end face to the heat sink core element 11, i.e., to an end face of the heat sink core element 11 that is oriented perpendicularly to the face walls 110, 113, 115 of the heat sink core element 11. The end-wall element 104 can in particular have flow openings 105 and can at least partially cover the flow shaft 119 formed in the heat sink core element 11, wherein the flow openings 105 in the end-wall element 104 are at least partially aligned with the flow shaft 119 or individual channels of the flow shaft 119 so that a fluid stream can flow through the flow shaft 119.

The end-wall element 104 can, for example, be made of an electrically and thermally insulating material, for example a plastic material. The end-wall element 104 thus provides protection against contact and additionally covers the heat sink core element 11 toward the outside at the end face so that a visual cover is provided and the heat sink core element 11 is not directly visible from the outside.

An electrical device 1 of the type described can be provided, in particular, within the framework of a modular system and can be flexibly configured. Within the framework of such a modular system, different heat sink core elements 11 and, in addition, external elements that can in each case be connected to the different heat sink core elements 11 in the form of further heat sink parts 11A-11D or housing walls 100 can be provided so that a user can choose from different heat sink core elements 11 as well as variably available external elements in order to configure and produce the electrical device 1.

Different heat sink core elements 11 can in particular have different widths, along the longitudinal extension direction of the mounting rail 2, so that, for example, electrical devices 1 of different power classes can be provided by selecting a suitable heat sink core element 11. All of the external elements of the modular system can in this case be connected to the different heat sink core elements 11 so that a user can variably select from different external elements, for example depending on a cooling function, for example in order to provide additional cooling via additional heat sink parts, or to create only one outer cover by selecting a housing wall.

The idea underlying the invention is not limited to the exemplary embodiments described above but can also be implemented in another way.

Since the heat sink core element in the electrical device forms a supporting structure via which printed circuit boards can be supported and additionally a connection to a supporting rail or another supporting base can be established, an electrical device with a simple structure can be obtained, in which the number of components is also reduced. In this way, efficient assembly and cost-effective production for the electrical device can result.

Such an electrical device can be one to be fastened to a mounting rail or also to another portable device, for example to a mounting surface or to a fastening device other than a mounting rail, for example within a switchgear cabinet.

Since the supporting structure is formed by a heat sink core element, efficient cooling also results so that favorable heat dissipation can be made possible. This results in an electrical device that is both mechanically stable and thermally robust and that can be used in a variety of ways, in particular in different power classes and with different housing form factors.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Electrical device
10 Housing part
100 External element (housing wall)
101 Front wall
102 Opening
103 Wall section
104 End-wall element
105 Flow openings
11 Heat sink (supporting structure)
11A-11D External element (heat sink part)
110 Face wall
111 Cooling ribs
112 Rib sections
113 Face wall (rear wall)
114 Body section
115 Face wall (front wall)
116 Connecting device
117 Heat-conducting connection
118 Support edge
119 Flow shaft
12 Fastening device
13-16 Supporting element (printed circuit board)
130-132 Plug-in connector module
133 Opening
140-142 Plug-in connector module
17 Front part
18 Functional component
180 Component
181 Enclosure
182 Electrical connection
183 Heat-conducting layer (heat-conducting paste)
19 Fastening elements
2 Mounting rail
X Longitudinal direction
Y Transverse direction
Z Height direction

What is claimed is:

1. An assembly of an electrical device, comprising:
at least one electrical functional assembly which has a supporting element and electrical or electronic functional components arranged on the supporting element;
a fastening device configured to fasten the electrical device to a higher-level assembly;
a heat sink core element having at least one face wall; and
an external element connectable to the heat sink core element,
wherein the heat sink core element forms a supporting structure of the electrical device on which supporting structure the fastening device is arranged,
wherein the external element is connectable to the heat sink core element such that the at least one electrical functional assembly is accommodated between the at least one face wall of the heat sink core element and the external element, and
wherein the fastening device is mounted at the heat sink core element for fastening the assembly to the higher-level assembly.

2. The assembly of claim 1, wherein the heat sink core element has two face walls extending in parallel to one another, and
wherein electrical functional assemblies are fastenable to sides of the two face walls facing away from one another.

3. The assembly of claim 2, wherein cooling ribs are formed between the two face walls extending in parallel to one another.

4. The assembly of claim 2, wherein in each case one external element is connectable to the two face walls extending in parallel to one another.

5. The assembly of claim 1, wherein the heat sink core element has four face walls which are arranged at right angles to one another so as to form a cuboid supporting structure.

6. The assembly of claim 1, wherein the at least one electrical functional assembly is fastenable to a first side of an associated face wall and cooling ribs are formed on a second side of the face wall facing away from the first side.

7. The assembly of claim 1, wherein the heat sink core element has at least one flow shaft through which a fluid flows.

8. The assembly of claim 7, wherein the flow shaft is directed vertically so as to conduct a convection flow.

9. The assembly of claim 7, further comprising:
an active fan configured to transport a fluid stream through the flow shaft.

10. The assembly of claim 7, wherein cooling ribs project into the flow shaft.

11. The assembly of claim 7, wherein the at least one electrical functional assembly is fastenable to a side of the at least one face wall facing away from the flow shaft.

12. The assembly of claim 7, further comprising:
an end-wall element comprising an electrically insulating material, which end-wall element has at least one flow opening for a fluid stream and is fastenable to the heat sink core element such that the end-wall element at least partially covers the flow shaft.

13. The assembly of claim 1, wherein the external element is formed by a heat sink part which is connectable to the heat sink core element in order to accommodate the at least one electrical functional assembly between the at least one face wall and the heat sink part.

14. The assembly of claim 13, wherein the heat sink part is thermally coupled to the heat sink core element.

15. The assembly of claim 1, wherein the external element is formed by a housing wall of a housing enclosing the heat sink core element, which housing wall is connectable to the heat sink core element in order to accommodate the at least one electrical functional assembly between the at least one face wall and the housing wall.

16. The assembly of claim 1, wherein the external element is floatingly connected to the heat sink core element such that the external element is movable at least along one spatial direction in relation to the heat sink core element.

17. The assembly of claim 1, wherein the higher-level assembly comprises a mounting rail configured to accommodate a plurality of electrical devices.

18. The assembly of claim 1, wherein the supporting element of the at least one electrical functional assembly is formed by a printed circuit board.

19. The assembly of claim 1, wherein the at least one electrical functional assembly has an SOM board which is connectable to the supporting element of the at least one electrical functional assembly.

20. The assembly of claim 1, wherein a plurality of bearing sections is formed on the at least one face wall, to which bearing sections the supporting element of the at least one electrical functional assembly is fastenable.

21. The assembly of claim 20, wherein the bearing sections project from the at least one face wall such that the supporting element is arranged in a fixed position at a distance from the at least one face wall.

22. The assembly of claim 1, wherein the heat sink core element is integrally formed from a thermally conductive material.

23. A modular system, comprising:
the assembly of claim 1;
a plurality of different heat sink core elements; and
a plurality of different external elements in each case connectable to the heat sink elements,
wherein one of the plurality of different heat sink core elements and at least one of the plurality of different external elements is selectable to produce the electrical device.

24. An electrical device, comprising:
the assembly of claim 1,
wherein the at least one electrical functional assembly is attached to the at least one face wall of the heat sink core element.

25. The electrical device of claim 24, wherein electrical or electronic functional components of the at least one electrical functional assembly are arranged on a side of the supporting element facing the at least one face wall and/or on a side of the supporting element facing away from the at least one face wall.

26. The electrical device of claim 24, further comprising:
a heat-conducting connection via which the at least one face wall is thermally connected to at least one electrical or electronic functional component of the at least one electrical functional assembly.

27. The electrical device of claim 26, wherein the supporting element of the at least one electrical functional assembly has an opening through which the heat-conducting connection extends, so that the heat-conducting connection thermally connects the at least one face wall to an electrical or electronic functional component of the at least one electrical functional assembly on a side of the supporting element facing away from the at least one face wall.

* * * * *